United States Patent [19]

Hawkins et al.

[11] Patent Number: 5,241,199
[45] Date of Patent: Aug. 31, 1993

[54] CHARGE COUPLED DEVICE (CCD) HAVING HIGH TRANSFER EFFICIENCY AT LOW TEMPERATURE OPERATION

[75] Inventors: Gilbert A. Hawkins, Mendon; Edward T. Nelson, Pittsford; Christopher R. Hoople, Rochester, all of N.Y.

[73] Assignee: Eastman Kodak Company, Rochester, N.Y.

[21] Appl. No.: 988,380

[22] Filed: Dec. 8, 1992

Related U.S. Application Data

[63] Continuation of Ser. No. 819,214, Jan. 10, 1992, abandoned.

[51] Int. Cl.[5] .......................................... H01L 29/796
[52] U.S. Cl. .................... 257/223; 257/183.1
[58] Field of Search ................ 357/24; 377/57-63; 257/222, 223, 183.1, 230

[56] References Cited

U.S. PATENT DOCUMENTS

| | | | |
|---|---|---|---|
| 3,792,465 | 2/1974 | Collins et al. | 357/24 |
| 3,973,136 | 8/1976 | Lee | 357/24 |
| 4,035,665 | 7/1977 | Borel et al. | 357/24 |
| 4,062,038 | 12/1977 | Cuomo et al. | 357/30 |
| 4,258,376 | 3/1981 | Shannon | 357/24 |
| 4,328,432 | 5/1982 | Yamazaki | 307/221 |
| 4,831,428 | 5/1989 | Yamaka | 357/16 |
| 4,901,129 | 2/1990 | Hynecek | 357/30 |
| 4,972,245 | 11/1990 | Yamaka et al. | 357/16 |
| 5,047,090 | 9/1991 | Hayashi et al. | 136/249 |

*Primary Examiner*—Gene M. Munson
*Attorney, Agent, or Firm*—Stephen C. Kaufman

[57] ABSTRACT

A charge coupled device having a layer of a semiconductor material on a surface of a substrate body of a semiconductor material. The layer is of a material which can be epitaxially deposited on the body with good crystalline quality. The material of the layer has a conduction band and/or valence band which is different from that of the body so as to provide a discontinuity in the energy level of the conduction band and/or valence band at the junction of the layer and the body during the operation of the charge coupled device. At least one electrode is over and insulated from the layer. The discontinuity in the conduction band and/or valence band creates a well in which photogenerated charge is collected.

12 Claims, 3 Drawing Sheets

CHARGE COUPLED DEVICE (CCD) HAVING HIGH TRANSFER EFFICIENCY AT LOW TEMPERATURE OPERATION

This is a continuation of application Ser. No. 07/819,214, filed Jan. 10, 1992, now abandoned.

FIELD OF THE INVENTION

The present invention relates to a charge-coupled device (CCD) having high transfer efficiency at low temperature operation, and, more particularly, to a CCD in which charge trapping is reduced to improve transfer efficiency.

BACKGROUND OF THE INVENTION

In the operation of CCDs, charge trapping during the transfer of the charge along the CCD typically limits charge transfer efficiency. This is particularly true under conditions of low temperatures and high operating speeds. This degrades device performance, especially for low signal levels. Charge trapping can occur at a variety of sites in the CCD. Such sites includes crystallographic imperfections, metallic impurities and ionized donors and acceptors. Although crystallographic imperfections can be limited by process improvements, trapping at donor sites still deteriorates performance. This is due to the necessity of dopants for channel potential control. Surface channel devices have been employed to reduce the problem of trapping at donor sites. However, this still leaves surface state trapping which is difficult to avoid. The use of unconventional dopants with energy levels more shallow than the donors conventionally used, such as boron and phosphorus, allow device operation at lower temperatures, but do not fundamentally solve the problem of impurity trapping.

SUMMARY OF THE INVENTION

The present invention is directed to a CCD which includes means for charge confinement in a potential well removed from the semiconductor surface without the use of dopants. This is achieved by a CCD which comprises a body of a semiconductor material having a surface and a layer of a semiconductor material on the surface of the body. The layer is of a material having a conduction band and/or valence band different from that of the material of the body so as to exhibit a discontinuity in the energy level of the conduction band and/or valence band at the interface of the layer and the body.

The invention will be better understood from the following more detailed description taken with the accompanying drawings.

The drawings are not necessarily to scale.

DETAILED DESCRIPTION

Figure 1:
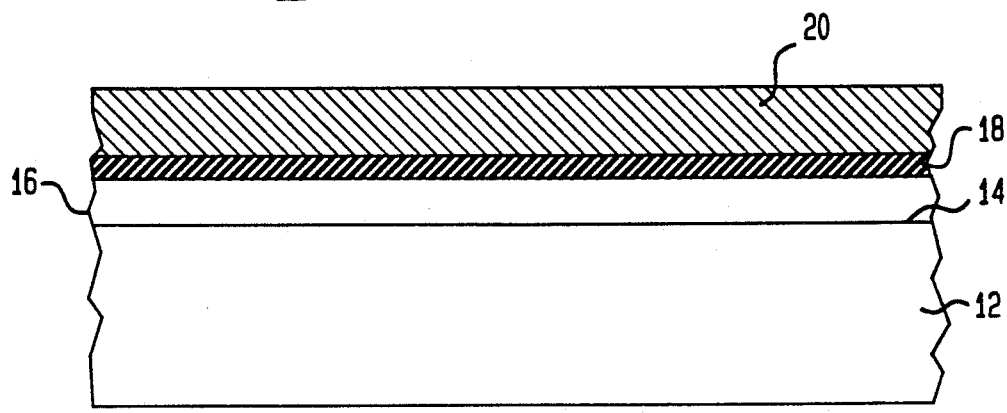
FIG. 1 is a sectional view of a CCD in accordance with the present invention.

Referring now to FIG. 1, there is shown a cross-sectional view of a portion of a basic structure of a charge-coupled device (CCD) 10 in accordance with the present invention. CCD 10 comprises a substrate body 12 having a surface 14. The body 12 is of a semiconductor material, such as single crystalline silicon, which is of either conductivity type, but preferably of p-type. On the surface 14 of the body 12 is a thin layer 16 of a semiconductor material which can be epitaxially grown on the material of the body 12 with good crystalline quality and which has a conduction band and/or valence band different from that of the material of the body 12. Such materials include alloys of silicon, such as $Si_{1-x}Ge_x$, where x is preferably between 0.2 and 0.8, group III-V materials, such as gallium arsenide, aluminum gallium arsenide or the like, and group II-VI materials, such as zinc sulfide. The material of the layer 16 is preferably undoped. This difference in the conduction band and/or valence band provides a discontinuity in the conduction band and/or valence band at the interface between the layer 16 and the body 12.

On the semiconductor layer, 16 is a thin layer 18 of a dielectric material, typically silicon dioxide. On the dielectric layer 16 is at least one gate electrode 20. The gate electrode 20 is of a conductive material, such as a metal or conductive polycrystalline silicon.

Figure 2:
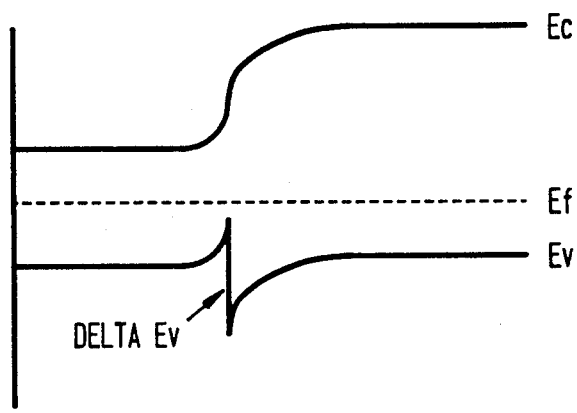
FIG. 2 is a band diagram of the CCD of the present invention with no bias applied thereto.
Figure 3:
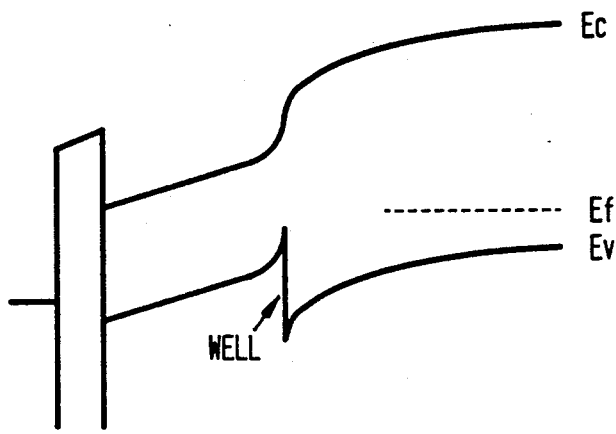
FIG. 3 is a band diagram of the CCD of the present invention with a positive bias applied to gate electrodes thereof.

Referring now to FIGS. 2 and 3, there are shown band diagrams for the electron potential energy as a function of depth into the CCD 10 shown in FIG. 1. FIG. 2 is a band diagram with no potential applied to the gate electrode 20 of CCD 10 and FIG. 3 is a band diagram with electrode 20 being biased positive. In a $Si_{1-x}Ge_x/Si$ system, the band gap of the alloy is substantially smaller than that of silicon. For the case of strained layer epitaxy of the alloy on silicon, the primary energy gap difference is accounted for by a valence band offset. As shown in FIG. 2, this valence band offset is indicated as Delta Ev. Under bias conditions, as shown in FIG. 3, the Delta Ev offset provides a well for photogenerated holes to accumulate in. Also, this structure has essentially no trapping sites in the region of stored charge because of the high degree of crystalline perfection of the alloy and the interface region. Thus, there is provided a region of potential confinement for photogenerated charge without impurity doping.

Figure 4:
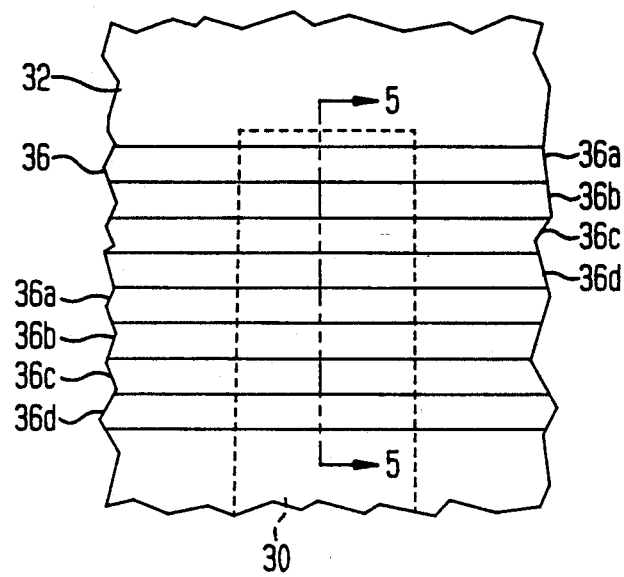
FIG. 4 is a top plan view of a typical CCD made in accordance with the present invention.
Figure 5:
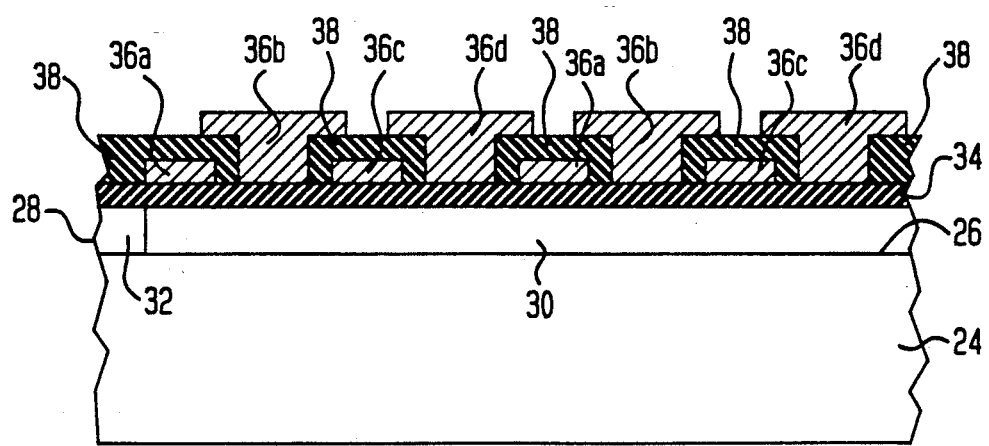
FIG. 5 is a sectional view taken along line 5—5 of FIG. 4.

Referring now to FIGS. 4 and 5, there are shown a top plan view (FIG. 4) and a sectional view (FIG. 5) of a four-phase CCD 22 in accordance with the present invention. CCD 22 comprises a substrate body 24 of a semiconductor material, such as p-type silicon, having a surface 26. On the surface 26 is a thin layer 28 of a semiconductor material having a conductance band and/or valence band which is different from that of the material of the body 24. One example of a material suitable for the layer 28 is undoped $Si_{1-x}Ge_x$. The semiconductor layer 28 contains a CCD channel region 30 having a field region 32 around it. The field region 32 may be formed by highly doping the area of the field region 32 with an n-type conductivity dopant, such as phosphorus, so that the field region 32 is of n+ type conductivity. The field region is generally doped at a concentration of $10^{19}$ to $10^{20}$ to $10^{21}$ impurities/cm$^3$. The field region 32, which acts as a channel stop, serves to confine stored charges in the CCD channel region 30.

On the semiconductor layer 28 is a thin dielectric layer 34, typically of silicon dioxide. On the dielectric layer 34 are a plurality of sets of gate electrodes 36a, 36b, 36c and 36d which extend across the channel region 30 and are in overlapping relation along the channel region 30. Adjacent gate electrodes are insulated from each other by a layer 38 of a dielectric material, such as silicon dioxide. As shown, the CCD 22 is a four-phase CCD with each set of gate electrodes 36a, 36b, 36c and 36d being connected to a source of potential, not shown.

Figure 6:
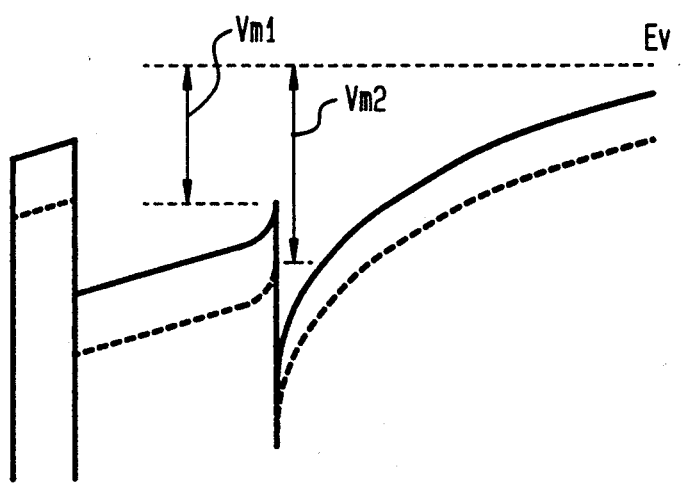
FIG. 6 is a band diagram under two electrodes of the CCD shown in FIG. 4.

FIG. 6 is a valence band diagram under two of the electrodes 36a and 36b. The solid line is for the electrodes 36a and the dash line is for the electrode 36b. It can be seen that a well is provided under each of the electrodes 36a and 36b so that charges generated under the electrodes 36a and 36b are stored in the well. Vm1 is the well potential maximum for the electrode 36a and Vm2 is the well potential maximum for the electrode 36b.

Figure 7:
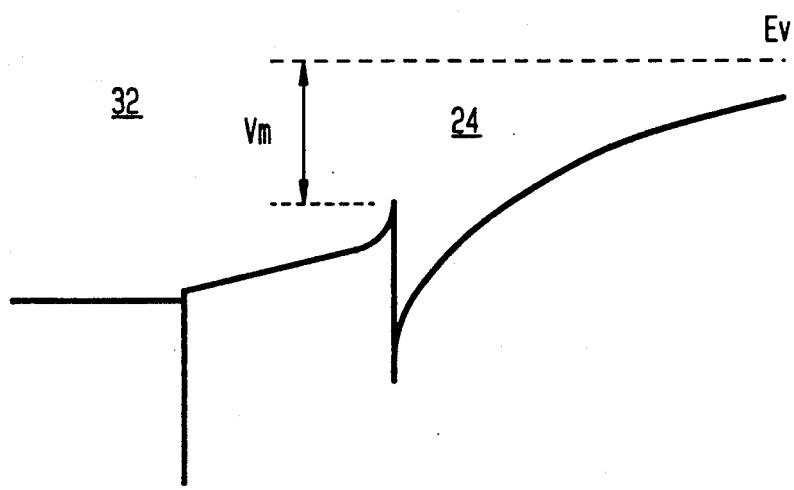
FIG. 7 is a band diagram of the field region of the CCD shown in FIG. 4 when a positive bias is applied thereto.

FIG. 7 is a valence band diagram for the potential in the field region 32 with a positive bias applied thereto. The well potential maximum, Vm, in the field region 32 is larger than the well potential maximum of the channel region 30 to ensure confinement of charge during electrode clocking.

Thus, there is provided by the present invention, a CCD 10 in which photogenerated charge in the channel region 30 is stored below the surface of the semiconductor layer 16 without doping the semiconductor layer 16. This reduces trapping of the charge so as to improve operation of the CCD at low temperatures. In addition, there is provided antiblooming protection when the charge capacity of the well is exceeded. When excess charge is generated, excess hole photocharge is bloomed into the substrate 12 while photoelectrons are drained away by the field region 32. Another advantage of the CCD 10 is that carriers at the interface of the semiconductor layer 28 and dielectric layer 34 can be used during charge integration to suppress interface dark current. Another advantage is that photogenerated charge is not scattered by dopant impurities during read-out of the device. This results in enhanced operating speeds.

It is to be appreciated and understood that the specific embodiments of the invention are merely illustrative of the general principles of the invention. Various modifications may be made consistent with the principles set forth. For example, although the CCD 22 is shown as a four phase CCD, it can be of any phase. Also, the CCD 22 may include more than one channel region 30 as long as the field region 32 extends around all of the channel regions. In addition, field and/or channel stop technologies other than n+ type conductivity regions may be used. For example, a p+ type conductivity region may be substituted for the n+ type region. Control of the potential is the field and channel regions may be achieved by such means as field plates or Schottky barriers. The field region may also be achieved by selectively eliminating the semiconductor layer 28 in those regions desired to be a barrier to photo charge transport or by selective deposition of the semiconductor material only in the regions where charge collection and transport are desired.

What is claimed is:

1. A charge coupled device comprising:
    a body of single crystalline silicon having a surface;
    a continuous layer of an alloy of silicon on and extending along the surface of the body, the layer having a conduction band and/or valence band which is different from that of the silicon of the body such that during the operation of the charge coupled device there is exhibited a discontinuity of the energy level of the conduction band and/or valence band at the interface between the layer and the body; and
    a plurality of electrodes over, spaced along and insulated from the layer of the silicon alloy.

2. The charge coupled device of claim 1 wherein the layer is of an alloy of silicon which can be epitaxially deposited on the surface of the body with good crystalline quality.

3. The charge coupled device of claim 1 in which the semiconductor layer is of an alloy of silicon and germanium.

4. The charge coupled device of claim 3 in which the semiconductor layer is of $Si_{1-x}Ge_x$, where x is between 0.2 and 0.8.

5. The charge coupled device of claim 4 in which the semiconductor layer is undoped.

6. A charge coupled device comprising:
    a body of a semiconductor material having a surface;
    at least one channel region on the surface of the body, the channel region being entirely of an undoped semiconductor material having a conduction band and/or valence band which is different from that of the material of the body such that during operation of the charge coupled device there is exhibited a discontinuity of the energy level of the conduction band and/or valence band at the interface of the channel region and the body;
    a field region around the channel region, the field region being of the same semiconductor material as the channel region but being doped so as to confine charge to the channel region;
    a dielectric layer on the channel region; and
    a plurality of separate electrodes on the dielectric layer and extending across the channel region.

7. The charge coupled device of claim 6 wherein the channel region is of a semiconductor material which can be epitaxially deposited on the body with good crystalline quality.

8. The charge coupled device of claim 6 wherein the body is of silicon and the channel region is of an alloy of silicon.

9. The charge coupled device of claim 8 wherein the channel region is of an alloy of silicon the germanium.

10. The charge coupled device of claim 9 wherein the channel region is of $Si_{1-x}Ge_x$, where x is between 0.2 and 0.8.

11. The charge coupled device of claim 6 in which the field region is highly doped n-type conductivity.

12. The charge coupled device of claim 6 further comprising a plurality of the channel regions on the body and the field region separates each channel region.

* * * * *